(12) United States Patent
Hamada

(10) Patent No.: US 10,763,112 B2
(45) Date of Patent: Sep. 1, 2020

(54) METHOD FOR MANUFACTURING DEVICE

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventor: Etsuo Hamada, Himeji (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 28 days.

(21) Appl. No.: 16/234,669

(22) Filed: Dec. 28, 2018

(65) Prior Publication Data

US 2020/0027723 A1  Jan. 23, 2020

(30) Foreign Application Priority Data

Jul. 20, 2018   (JP) ................. 2018-136784

(51) Int. Cl.
*H01L 21/027* (2006.01)
*H01L 21/78* (2006.01)
(Continued)

(52) U.S. Cl.
CPC .......... *H01L 21/0274* (2013.01); *G03F 7/038* (2013.01); *G03F 7/16* (2013.01); *G03F 7/20* (2013.01); *G03F 7/2024* (2013.01); *G03F 7/26* (2013.01); *H01L 21/0272* (2013.01); *H01L 21/0475* (2013.01); *H01L 21/0485* (2013.01);
(Continued)

(58) Field of Classification Search
CPC ... H01L 21/0274; H01L 29/401; H01L 21/78; H01L 29/1608; H01L 29/2003; H01L 21/0475; H01L 29/6606; H01L 29/66068; H01L 29/66333; H01L 21/0485; H01L 21/28; H01L 21/30625; H01L 29/66212; H01L 29/66522; H01L 21/0272; H01L 21/02057; H01L 29/7813; H01L 29/0619; H01L 29/872; G03F 7/038; G03F 7/16;
(Continued)

(56) References Cited

FOREIGN PATENT DOCUMENTS

| JP | 59-116749 | 7/1984 |
| JP | 61-212844 | 9/1986 |

(Continued)

*Primary Examiner* — Caleen O Sullivan
(74) *Attorney, Agent, or Firm* — Oblon, McClelland, Maier & Neustadt, L.L.P.

(57) ABSTRACT

According to one embodiment, a method for manufacturing a device includes a first process, a second process, a third process, and a fourth process. The first process includes providing a structure body at a first surface of a substrate. The substrate is light-transmissive and has a second surface. A light transmissivity of the structure body is lower than a light transmissivity of the substrate. The second process includes providing a negative-type photoresist at the second surface. The third process includes irradiating the substrate with light to expose a portion of the photoresist. The light is irradiated in a first direction from the first surface toward the second surface. The light passes through the substrate. The fourth process includes developing the photoresist to remain the portion of the photoresist in a state of being adhered to the second surface and to remove other portion of the photoresist.

11 Claims, 11 Drawing Sheets

(51) Int. Cl.

| | |
|---|---|
| *H01L 21/28* | (2006.01) |
| *H01L 21/306* | (2006.01) |
| *H01L 29/40* | (2006.01) |
| *H01L 29/16* | (2006.01) |
| *H01L 29/20* | (2006.01) |
| *H01L 29/66* | (2006.01) |
| *G03F 7/038* | (2006.01) |
| *G03F 7/16* | (2006.01) |
| *G03F 7/20* | (2006.01) |
| *G03F 7/26* | (2006.01) |
| *H01L 21/04* | (2006.01) |
| *H01L 21/02* | (2006.01) |

(52) U.S. Cl.
CPC ........ *H01L 21/28* (2013.01); *H01L 21/30625* (2013.01); *H01L 21/78* (2013.01); *H01L 29/1608* (2013.01); *H01L 29/2003* (2013.01); *H01L 29/401* (2013.01); *H01L 29/6606* (2013.01); *H01L 29/66068* (2013.01); *H01L 29/66212* (2013.01); *H01L 29/66333* (2013.01); *H01L 29/66522* (2013.01); *H01L 21/02057* (2013.01)

(58) Field of Classification Search
CPC . G03F 7/20; G03F 7/26; G03F 7/2024; G03F 7/2022; G01C 19/5712
USPC ............................................ 438/462; 378/35
See application file for complete search history.

(56) References Cited

FOREIGN PATENT DOCUMENTS

| | | |
|---|---|---|
| JP | 2-3218 | 1/1990 |
| JP | 10-177974 | 6/1998 |

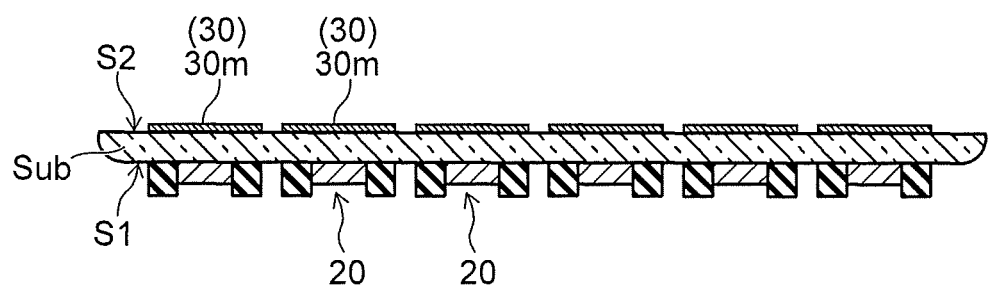
FIG. 4A
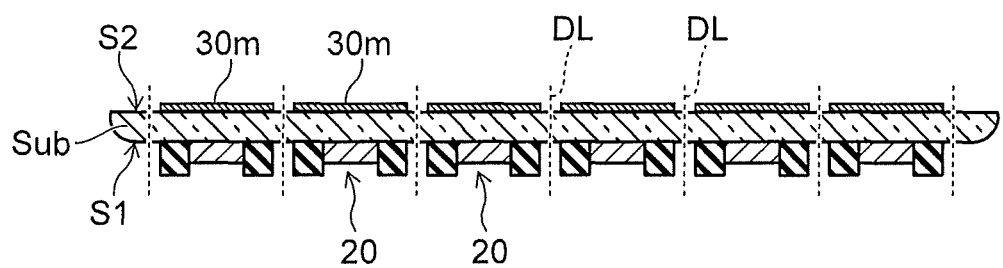
FIG. 4B
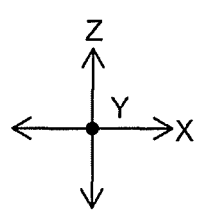

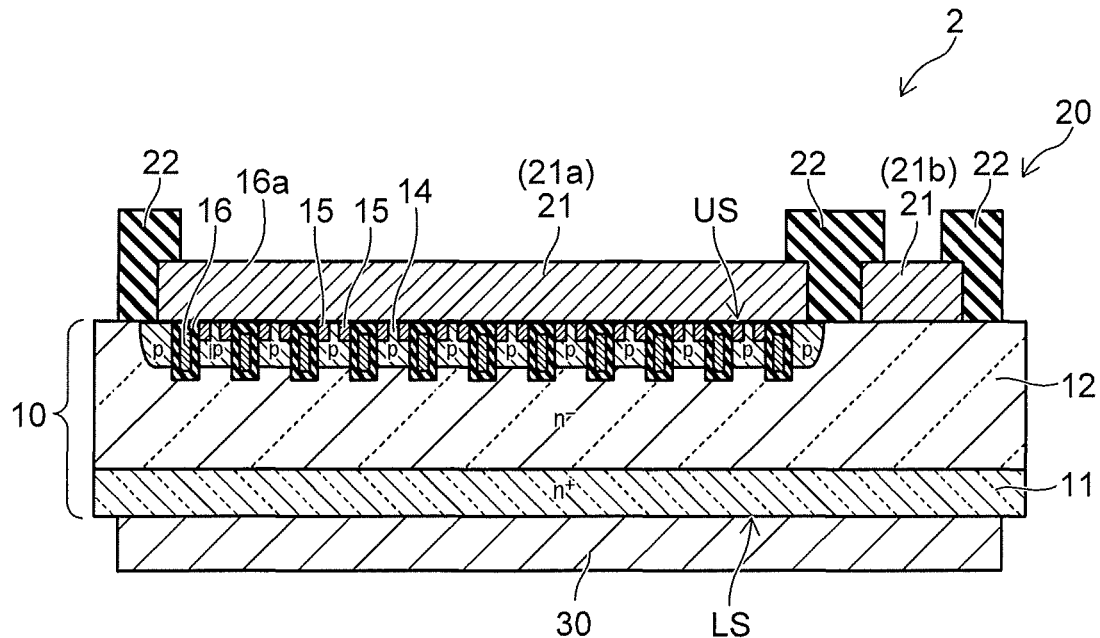
FIG. 6A
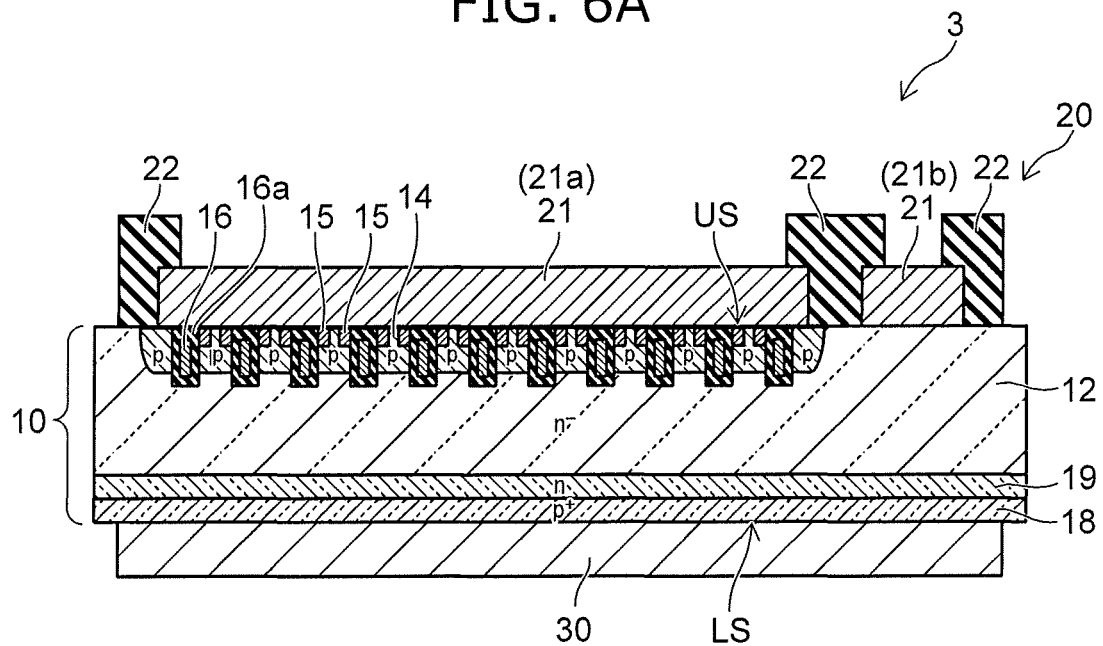
FIG. 6B
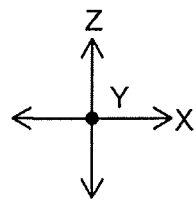

METHOD FOR MANUFACTURING DEVICE

CROSS-REFERENCE TO RELATED APPLICATIONS

This application is based upon and claims the benefit of priority from Japanese Patent Application No. 2018-136784, filed on Jul. 20, 2018; the entire contents of which are incorporated herein by reference.

FIELD

Embodiments described herein relate generally to a method for manufacturing a device.

BACKGROUND

There are devices in which structure bodies such as electrodes or the like are provided on two surfaces of a substrate. It is desirable to reduce the cost of the methods for manufacturing such devices.

BRIEF DESCRIPTION OF THE DRAWINGS

FIGS. 2A to 4B are process cross-sectional views showing a method for manufacturing the device according to the embodiment;

FIGS. 6A and 6B are cross-sectional views illustrating other devices manufactured by the manufacturing method according to the embodiment;

DETAILED DESCRIPTION

Figure 1:
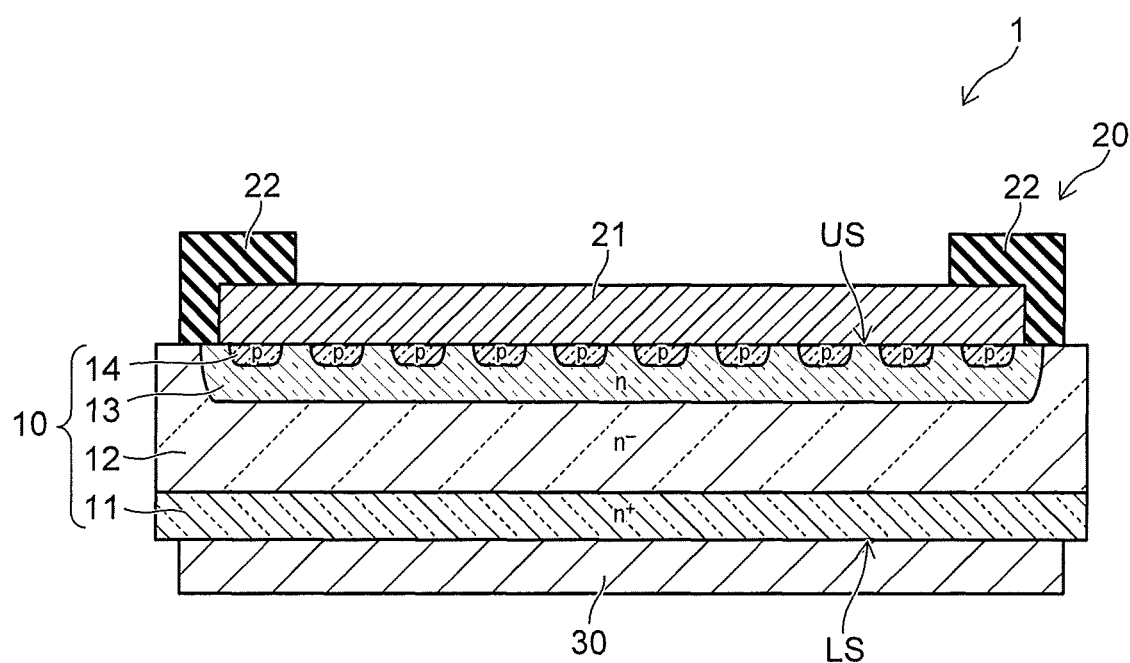
FIG. 1 is a cross-sectional view illustrating a device manufactured by a manufacturing method according to an embodiment.

According to one embodiment, a method for manufacturing a device includes a first process, a second process, a third process, and a fourth process. The first process includes providing a structure body at a first surface of a substrate. The substrate is light-transmissive and has a second surface on a side opposite to the first surface. A light transmissivity of the structure body is lower than a light transmissivity of the substrate. The second process includes providing a negative-type photoresist at the second surface. The third process includes irradiating the substrate with light to expose a portion of the photoresist by using the structure body as a mask. The light is irradiated in a first direction from the first surface toward the second surface. The light passes through the substrate and is incident at the portion of the photoresist. The fourth process includes developing the photoresist to remain the portion of the photoresist in a state of being adhered to the second surface and to remove other portion of the photoresist.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

FIG. 1 is a cross-sectional view illustrating a device manufactured by a manufacturing method according to an embodiment.

In the example illustrated in FIG. 1, the device 1 is a Schottky barrier diode. The device 1 includes a semiconductor layer 10, a first electrode 21, an insulating portion 22, and a second electrode 30.

The semiconductor layer 10 has an upper surface US, and a lower surface LS on the side opposite to the upper surface US. The first electrode 21 and the insulating portion 22 are provided at the upper surface US. The insulating portion 22 is provided around the first electrode 21. The second electrode 30 is provided at the lower surface LS.

In the drawings and the description recited below, the notations of $n^+$, n, $n^-$, $p^+$, and p indicate relative levels of the impurity concentrations of the conductivity types. In other words, a notation marked with "+" indicates that the impurity concentration is relatively higher than that of a notation not marked with either "+" or "−;" and a notation marked with "−" indicates that the impurity concentration is relatively lower than that of a notation without any mark. In the case where both a p-type impurity and an n-type impurity are included in each region, these notations indicate the relative level of the net impurity concentration after the impurities are compensated.

In the embodiments described below, the p-type and the n-type of each semiconductor region may be reversed.

The semiconductor layer 10 includes, for example, an $n^+$-type semiconductor region 11, an $n^-$-type semiconductor region 12, an n-type semiconductor region 13, and a p-type semiconductor region 14. The $n^+$-type semiconductor region 11 is provided on the second electrode 30 and is electrically connected to the second electrode 30. The $n^-$-type semiconductor region 12 is provided on the $n^+$-type semiconductor region 11. The n-type semiconductor region 13 is provided on the $n^-$-type semiconductor region 12. The p-type semiconductor regions 14 are multiply provided on the n-type semiconductor region 13 and are electrically connected to the first electrode 21.

The semiconductor layer 10 is light-transmissive. The light transmissivity of the first electrode 21 is lower than the light transmissivity of the semiconductor layer 10. For example, the light transmissivity of the insulating portion 22 is lower than the light transmissivity of the semiconductor layer 10. The second electrode 30 may be light-transmissive or may not be light-transmissive.

The semiconductor layer 10 includes silicon carbide or gallium nitride as a semiconductor material. In the case where silicon carbide is used as the semiconductor material, nitrogen or phosphorus is used as the n-type impurity; and aluminum or boron is used as the p-type impurity.

The first electrode 21 and the second electrode 30 include a metal such as aluminum, copper, etc. The insulating portion 22 includes an organic insulating material such as an epoxy resin, etc. The insulating portion 22 may include an inorganic insulating material such as silicon oxide, silicon nitride, etc. Or, the insulating portion 22 may include a layer including an inorganic insulating material and a layer including an organic insulating material. In the case where the light transmissivity of the insulating portion 22 is lower than the light transmissivity of the semiconductor layer 10, the insulating portion 22 includes an epoxy resin, silicon nitride, etc.

FIG. 2A to FIG. 4B are process cross-sectional views illustrating a method for manufacturing the device according to the embodiment.

Figure 5A:
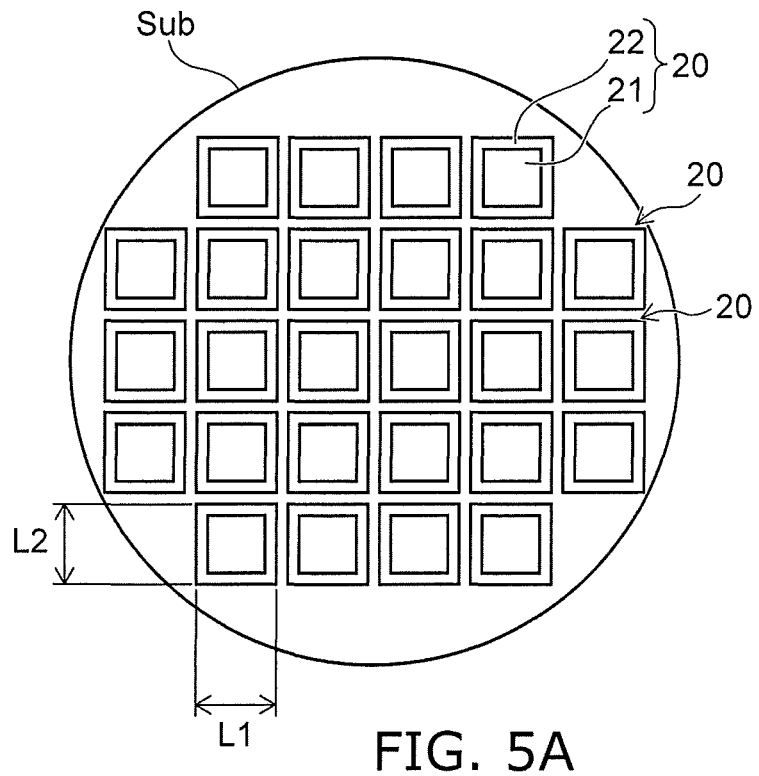
FIGS. 5A and 5B are process plain view showing the method for manufacturing the device according to the embodiment.
Figure 5B:
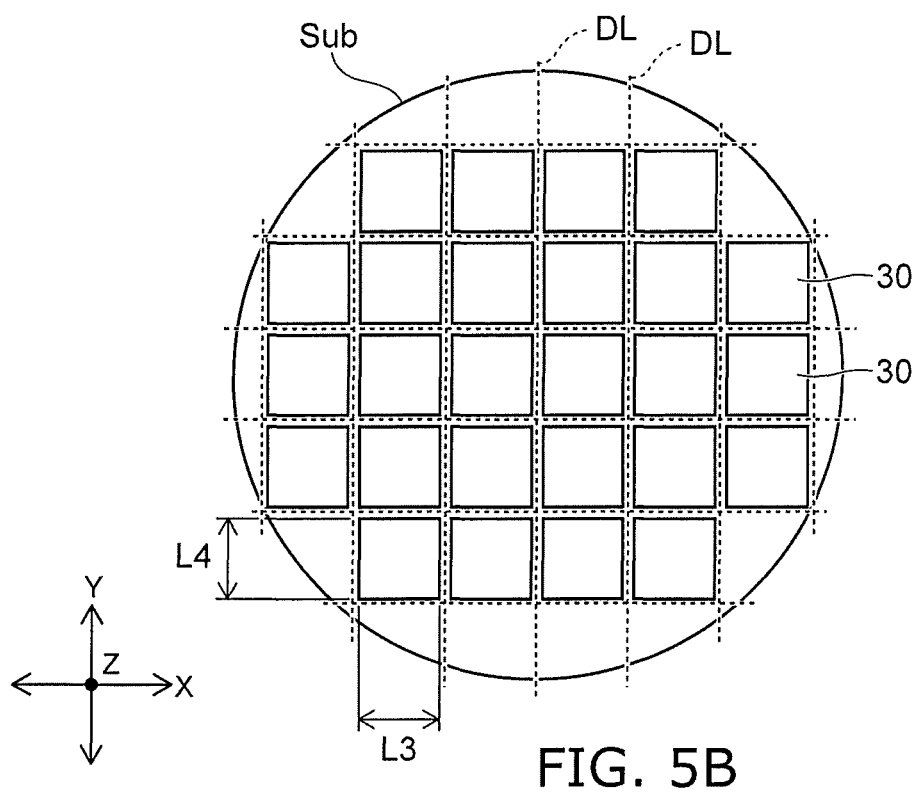

FIGS. 5A and 5B are process plan views illustrating the method for manufacturing the device according to the embodiment.

Figure 2A:
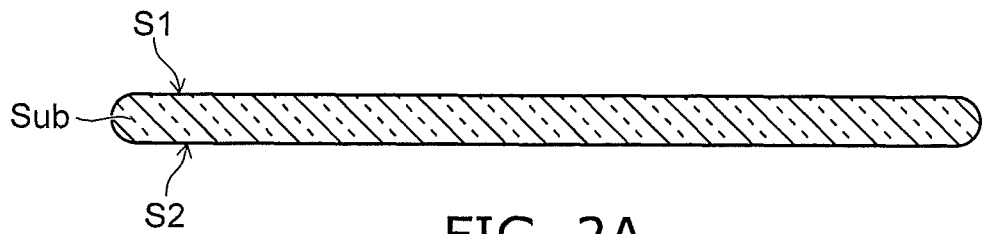

A substrate Sub is prepared as illustrated in FIG. 2A. The substrate Sub includes a semiconductor material similar to the semiconductor layer 10 described above. The substrate Sub has a first surface S1, and a second surface S2 on the side opposite to the first surface S1. An XYZ orthogonal coordinate system is used in the description of the embodiments hereinafter. A direction from the first surface S1 toward the second surface S2 is taken as a Z-direction (a first direction). Two mutually-orthogonal directions perpendicular to the Z-direction are taken as an X-direction (a second direction) and a Y-direction.

Figure 2B:
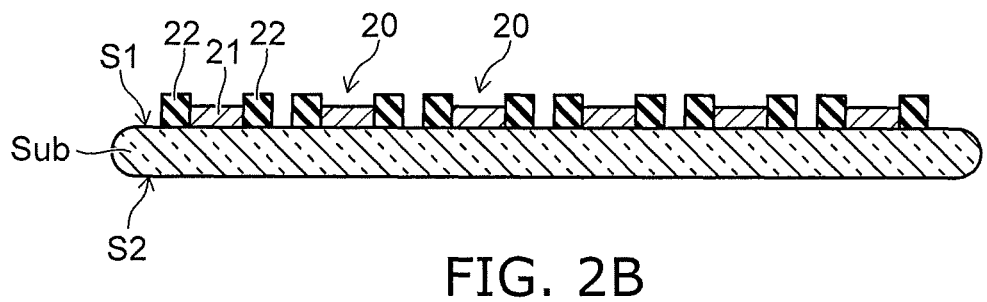

Not-illustrated semiconductor regions are formed by appropriately performing ion implantation into the substrate Sub. As illustrated in FIG. 2B, multiple structure bodies 20 are formed at the first surface S1. The structure bodies 20 each include the first electrode 21 and the insulating portion 22 illustrated in FIG. 1. As illustrated in FIG. 5A, the multiple structure bodies 20 are separated from each other in the X-direction and the Y-direction.

Figure 2C:
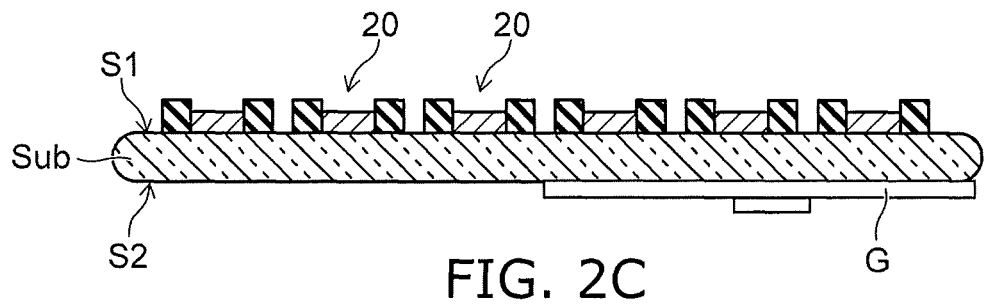
Figure 2D:
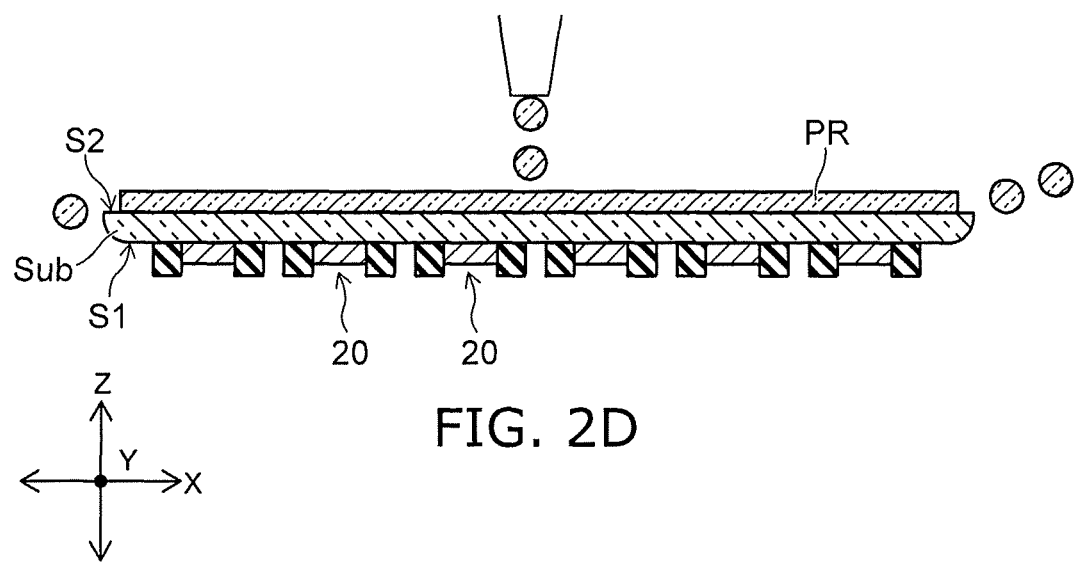
Figure 3A:
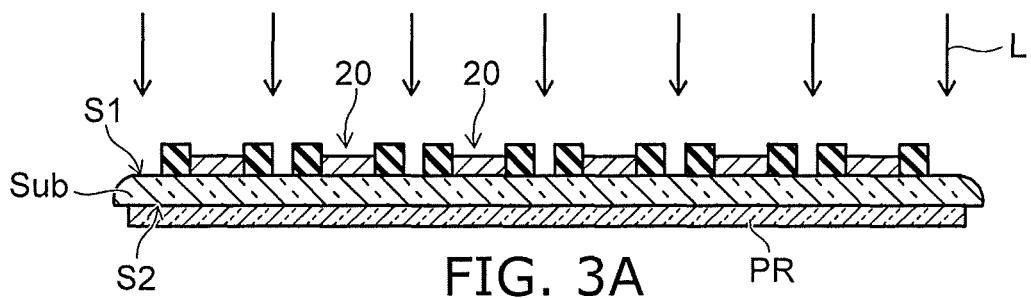

The second surface S2 side of the substrate Sub is polished until the substrate Sub has a prescribed thickness. For example, as illustrated in FIG. 2C, the polishing is performed by causing a grinder G to contact the second surface S2 of the substrate Sub and by rotating the grinder G and the substrate Sub. As illustrated in FIG. 2D, a photoresist PR is provided on the polished second surface S2. The photoresist PR is a negative-type. As illustrated in FIG. 3A, light L is irradiated along the Z-direction.

The substrate Sub is light-transmissive. The light transmissivity of the structure body 20 is lower than the light transmissivity of the substrate Sub. The wavelength of the light L is set to a value that is not easily absorbed by the substrate Sub. For example, in the case where the substrate Sub includes silicon carbide, the light L of a wavelength of 405 nm (the h-line) is used.

The light L that is incident at the gap between the structure bodies 20 passes through the substrate Sub and incident at a portion of the photoresist PR. A portion of the photoresist PR where the light L is irradiated is cured. The light L that is incident on the structure bodies 20 does not pass through the structure bodies 20 and is not incident on the substrate Sub. Or, even in the case where the light L passes through the structure bodies 20, the intensity of the light L is lower than the intensity necessary to cure the photoresist PR. In other words, the structure bodies 20 function as a mask when exposing the photoresist PR.

Figure 3B:
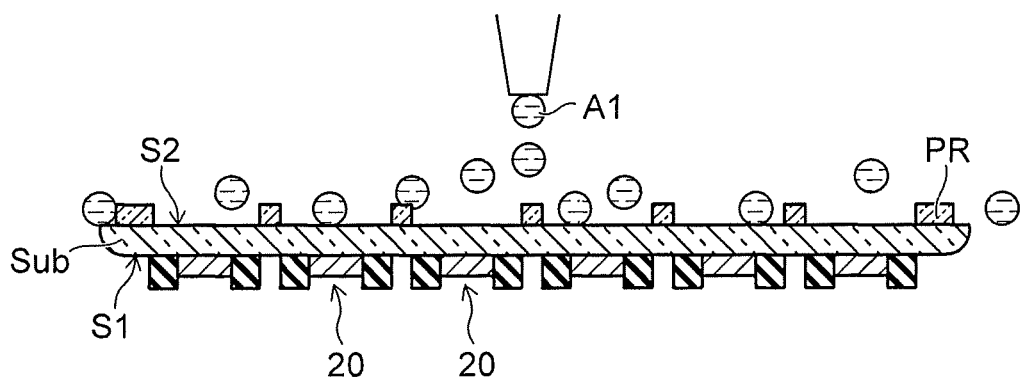
Figure 3C:
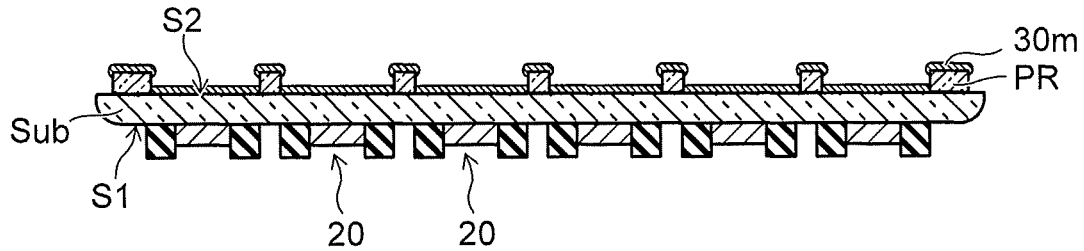

A chemical liquid A1 is coated onto the photoresist PR; and the photoresist PR is developed. Thereby, as illustrated in FIG. 3B, the other portion of the photoresist PR that is not exposed is removed and a portion of the second surface S2 is exposed. The portion of the photoresist PR remains in a state of being adhered to the second surface S2. As illustrated in FIG. 3C, a metal layer 30m is formed to cover the portion of the photoresist PR and the exposed portion of the second surface S2.

Figure 3D:
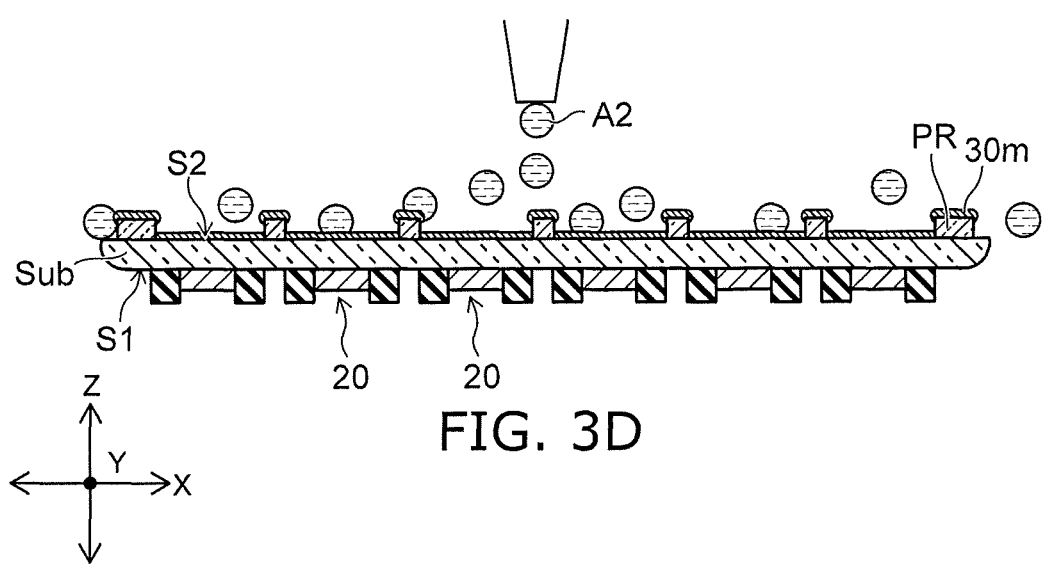

As illustrated in FIG. 3D, a chemical liquid A2 for removing the photoresist PR is coated onto the second surface S2. A portion of the metal layer 30m formed on the photoresist PR is removed when removing the photoresist PR. As illustrated in FIG. 4A, another portion of the metal layer 30m remains on the second surface S2. As a result, the multiple second electrodes 30 that are separated from each other in the X-direction and the Y-direction are formed. A portion of the second surface S2 is exposed by the removal of the photoresist PR.

As illustrated in FIG. 4B, the substrate Sub is diced along a dicing line DL. As illustrated in FIG. 4B and FIG. 5B, the dicing line DL passes between the structure bodies 20 and through the portion where the metal layer 30m was removed. By the processes recited above, the device 1 illustrated in FIG. 1 is manufactured.

Effects of the embodiment will now be described.

A method for manufacturing a device is illustrated below as a reference example. First, the multiple structure bodies 20 are formed at the first surface S1 of the substrate Sub. Then, the metal layer 30m is formed directly on the entire surface of the second surface S2. A photoresist is formed on the metal layer 30m. Continuing, patterning is performed by exposing the photoresist. The metal layer 30m is patterned using the patterned photoresist as a mask. According to the manufacturing method, the mutually-separated multiple second electrodes 30 can be formed at the second surface S2. It is unnecessary to perform dicing of the metal layer 30m because the substrate Sub is diced between the second electrodes 30.

Generally, the material of the metal layer 30m is softer than the material of the substrate Sub. In the case where the substrate Sub is diced using a blade, the material of the metal layer 30m clogs the blade when the metal layer 30m is diced. When the blade is clogged, there is a possibility that dicing of the substrate Sub and the metal layer 30m cannot be performed appropriately; and quality defects may occur. Or, in the case where laser dicing of the substrate Sub is performed, the laser is reflected by the metal layer 30m. In the case where Stealth dicing (registered trademark) of the substrate Sub is performed, cracks occur less easily in the metal layer 30m than in the substrate Sub. Accordingly, in the case where these methods are used to perform the dicing, it is necessary to perform the dicing of the metal layer 30m using another method; and the number of processes increases.

According to the manufacturing method according to the reference example, the problems recited above can be solved because the dicing of the metal layer is unnecessary.

On the other hand, according to the manufacturing method according to the reference example, it is necessary to pattern the photoresist on the second surface S2 side to match the arrangement of the structure bodies 20 provided on the first surface S1. An exposure apparatus that includes such a two-sided alignment function is expensive; and the cost of the device that is manufactured increases.

According to the manufacturing method according to the embodiment, the light L is irradiated on the photoresist PR of the second surface S2 through the substrate Sub from the first surface S1 side. The light transmissivity of the structure body 20 is lower than the light transmissivity of the substrate Sub. The photoresist PR is exposed according to the arrangement of the structure bodies 20. According to the embodiment, an exposure apparatus that includes a two-sided alignment function is unnecessary; and the cost necessary to expose the photoresist PR can be reduced. As a result, the cost of the device that is manufactured can be reduced.

According to the manufacturing method according to the embodiment as illustrated in FIG. 2C, the second surface S2 side of the substrate Sub is polished before exposing the photoresist PR. By causing the thickness of the substrate Sub to be thin, the light L that is incident on the substrate Sub between the structure bodies 20 easily passes through the substrate Sub. Thereby, the precision of the patterning of the photoresist PR can be increased.

The second surface S2 of the substrate Sub may be cleaned after polishing the substrate Sub and before providing the photoresist PR. A contaminant such as polishing debris, etc., adhered to the second surface S2 of the substrate Sub is removed by the cleaning. For example, the cleaning is performed using water, hydrofluoric acid, a surfactant, etc. By removing the contaminant, the adhesion between the second surface S2 and the photoresist PR improves. When exposing the photoresist PR, the reflection by the contaminant of the light L passing through the substrate Sub can be suppressed; and the precision of the patterning of the photoresist PR can be increased.

When exposing the photoresist PR, a sufficient amount of the light L is incident on the substrate Sub; therefore, it is desirable for the distance between the structure bodies 20 to be 10 μm or more. On the other hand, in the case where the distance is too long, the number of devices obtained from one substrate Sub decreases. From these perspectives, it is desirable for the distance to be not less than 10 μm and not more than 1 mm.

For example, according to the manufacturing method according to the embodiment as illustrated in FIG. 5A and FIG. 5B, a length L3 in the X-direction and a length L4 in the Y-direction of the second electrode 30 are respectively the same as a length L1 in the X-direction and a length L2 in the Y-direction of the structure body 20. Errors in the lengths L1 to L4 may exist. For example, errors of 10% or less may occur in these lengths. Accordingly, these lengths are taken to be substantially the same in the case where the difference between the length L1 and the length L3 is not more than 10% of the length L1 or the length L3. These lengths are taken to be substantially the same in the case where the difference between the length L2 and the length L4 is not more than 10% of the length L2 or the length L4.

The specific configuration of the structure body 20 is modifiable as appropriate. For example, the insulating portion 22 may be light-transmissive; and the first electrode 21 may function as the structure body 20 for shielding the light L. In such a case, the length in the X-direction and the length in the Y-direction of the second electrode 30 are respectively substantially the same as the length in the X-direction and the length in the Y-direction of the first electrode 21.

The device that is manufactured by the manufacturing method according to the embodiment is not limited to the example of FIG. 1. For example, in the device 1, the structure of the semiconductor regions of the semiconductor layer 10 may be different from that of FIG. 1. Or, the device 1 may be a P-N diode or a P-I-N diode. Or, the device 1 may be a MOSFET (Metal Oxide Semiconductor Field Effect Transistor) or an IGBT (Insulated Gate Bipolar Transistor) described below. The numbers, the configurations, the materials, etc., of the first electrode 21, the insulating portion 22, and the second electrode 30 are modifiable as appropriate according to the device. The timing of forming each semiconductor region of the semiconductor layer 10 is arbitrary and is not limited to the examples described above.

FIGS. 6A and 6B are cross-sectional views illustrating other devices manufactured by the manufacturing method according to the embodiment.

Figure 7:
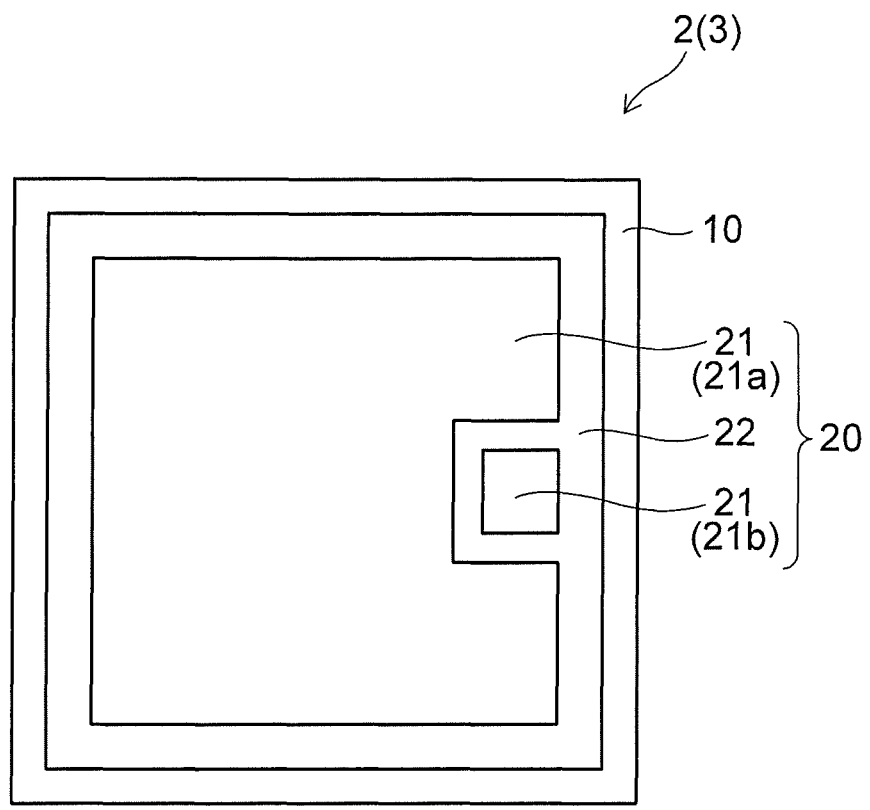
FIG. 7 is a plan view illustrating the other devices manufactured by the manufacturing method according to the embodiment.
Figure 7:
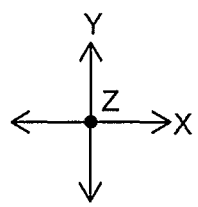

FIG. 7 is a plan view illustrating the other devices manufactured by the manufacturing method according to the embodiment.

A device 2 illustrated in FIG. 6A is a MOSFET. In the device 2, the semiconductor layer 10 includes the $n^+$-type semiconductor region 11, the $n^-$-type semiconductor region 12, the p-type semiconductor region 14, and an $n^+$-type semiconductor region 15. The p-type semiconductor region 14 is provided on the $n^-$-type semiconductor region 12. The $n^+$-type semiconductor region 15 is provided on the p-type semiconductor region 14. A gate electrode 16 is provided in the semiconductor layer 10. The gate electrode 16 opposes the $n^-$-type semiconductor region 12, the p-type semiconductor region 14, and the $n^+$-type semiconductor region 15 with a gate insulating layer 16a interposed.

The structure body 20 is provided at the upper surface US. In the device 2, the structure body 20 includes the insulating portion 22 and the multiple first electrodes 21. The multiple first electrodes 21 include an electrode 21a and an electrode 21b. The electrode 21a is provided on the p-type semiconductor region 14 and the $n^+$-type semiconductor region 15 and is electrically connected to these regions. The electrode 21b is electrically connected to the gate electrode 16. As illustrated in FIG. 6A and FIG. 7, the multiple first electrodes 21 are separated from each other. The insulating portion 22 is provided around the electrodes 21a and 21b and between the electrodes 21a and 21b.

A device 3 illustrated in FIG. 6B is an IGBT. In the device 3, the semiconductor layer 10 includes a $p^+$-type semiconductor region 18 and an n-type semiconductor region instead of the $n^+$-type semiconductor region 11. The $p'$-type semiconductor region 18 is electrically connected to the second electrode 30. The n-type semiconductor region 19 is provided between the $p'$-type semiconductor region 18 and the $n^-$-type semiconductor region 12. In the device 3 as well, the structure body 20 includes the insulating portion 22 and the multiple first electrodes 21.

It is possible to apply the manufacturing method according to the embodiment also to the methods for manufacturing the devices 2 and 3. In other words, as illustrated in FIG. 2A to FIG. 4B, the photoresist PR that is provided at the second surface S2 is exposed using the structure bodies 20 provided at the first surface S1 of the substrate Sub as a mask. Thereby, the mutually-separated multiple second electrodes 30 can be formed at the second surface S2. As a result, the cost necessary to manufacture the devices 2 and 3 can be reduced.

When manufacturing the devices 2 and 3, it is desirable for the light transmissivities of the first electrodes 21 and the insulating portion 22 to be lower than the light transmissivity of the semiconductor layer 10 (the substrate Sub). In the case where the insulating portion 22 is light-transmissive, the light L is incident on the substrate Sub at the gap between the first electrodes 21 in the process illustrated in FIG. 3A. As a result, the mutually-separated multiple second electrodes 30 can be formed for one device. By setting the light transmissivity of the insulating portion 22 to be lower than the light transmissivity of the semiconductor layer 10 (the substrate Sub), it is difficult for the light L to be incident on the substrate Sub at the gap between the first electrodes 21. Thereby, one second electrode 30 can be formed for one device.

In the examples illustrated in FIG. 6A and FIG. 6B, the devices 2 and 3 have trench structures in which the gate electrode 16 is provided inside the semiconductor layer 10. The devices 2 and 3 are not limited to the examples; and the devices 2 and 3 may have planar structures in which the gate electrode 16 is provided on the semiconductor layer 10.

Examples are described above in which a semiconductor device is manufactured by the manufacturing method according to the embodiment. The manufacturing method according to the embodiment is applicable also to examples other than the manufacture of semiconductor devices. Cases will now be described where the manufacturing method according to the embodiment is applied to a method for manufacturing another device.

Figure 8A:
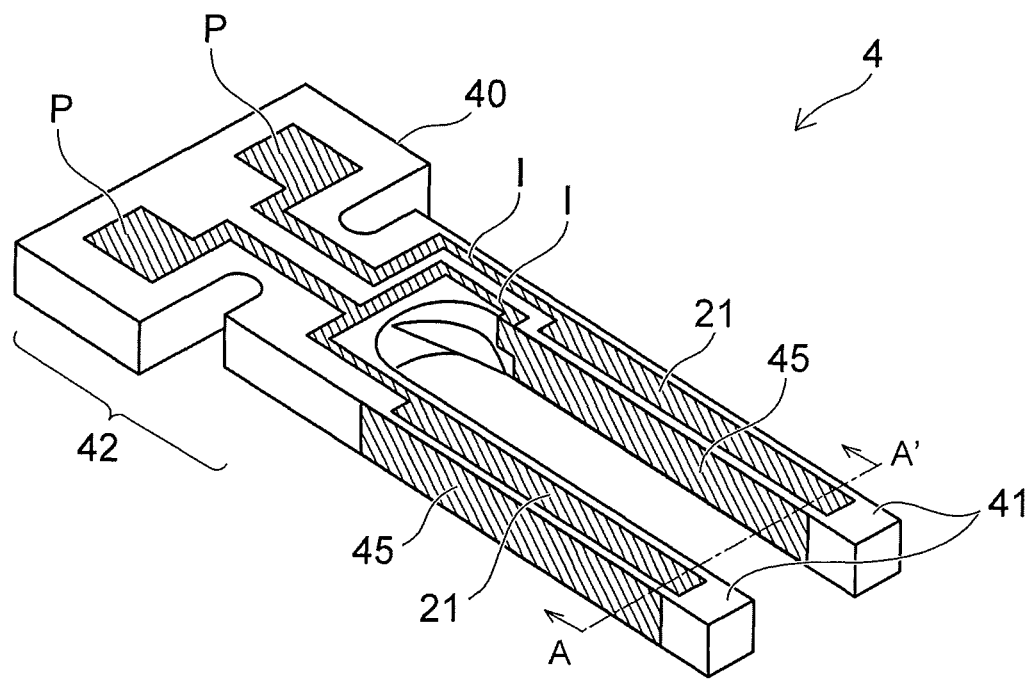
FIGS. 8A and 8B are drawings illustrating another device manufactured by the manufacturing method according to the embodiment.
Figure 8B:
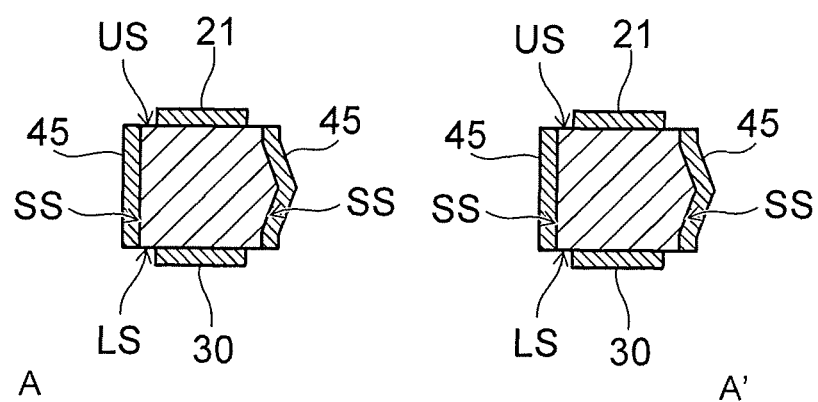

FIGS. 8A and 8B are drawings illustrating another device manufactured by the manufacturing method according to the embodiment.

FIG. 8A is a perspective view; and FIG. 8B is a cross-sectional view along line A-A' of FIG. 8A.

The device 4 is a gyro sensor. As illustrated in FIG. 8A and FIG. 8B, the device 4 includes the first electrode 21, the second electrode 30, a base member 40, and a third electrode 45. The base member 40 includes multiple extension portions 41 and a link portion 42. The multiple extension portions 41 are separated from each other and extend parallel to each other. The link portion 42 links one end of each of the extension portions 41.

As illustrated in FIG. 8B, the first electrode 21 is provided at the upper surface US of the extension portion 41. The second electrode 30 is provided at the lower surface LS of the extension portion 41. The third electrode 45 is provided at side surfaces SS of the extension portion 41. The first electrode 21, the second electrode 30, and the third electrode 45 are separated from each other.

Multiple interconnects I and multiple electrode pads P are provided at the upper surface US of the link portion 42. Not-illustrated multiple interconnects and multiple electrode pads also are provided at the lower surface LS of the link portion 42. The first electrodes 21, the second electrodes 30, and the third electrodes 45 are connected to the multiple electrode pads via the multiple interconnects.

The base member 40 is light-transmissive. The light transmissivities of the first electrode 21, the second electrode 30, and the third electrode 45 are lower than the light transmissivity of the base member 40. The base member 40 includes silicon oxide (quartz). The first electrode 21, the second electrode 30, and the third electrode 45 include a metal such as aluminum, copper, etc.

FIG. 9A to FIG. 10C are process cross-sectional views illustrating another method for manufacturing the device according to the embodiment.

Figure 11A:
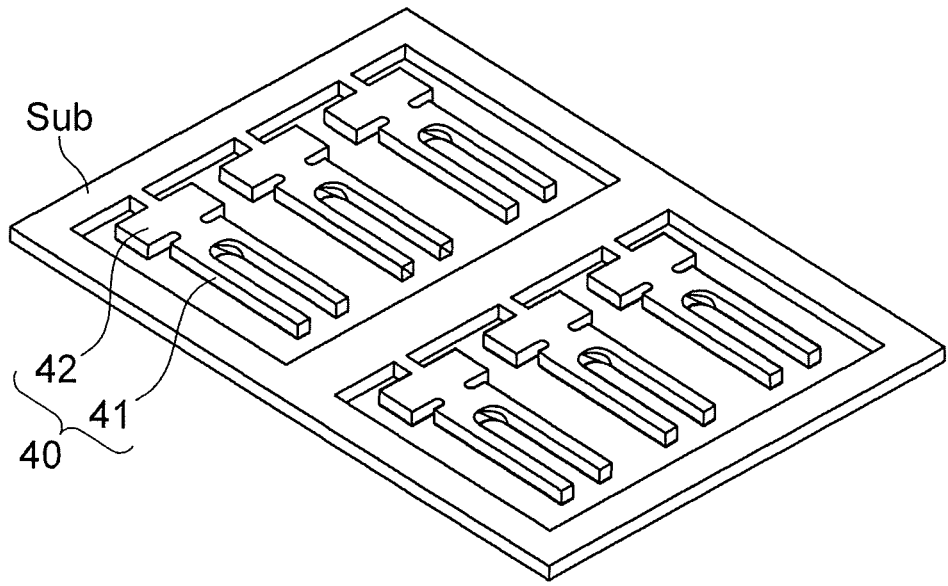
FIGS. 11A and 11B are process perspective views showing the other method for manufacturing the device according to the embodiment.
Figure 11B:
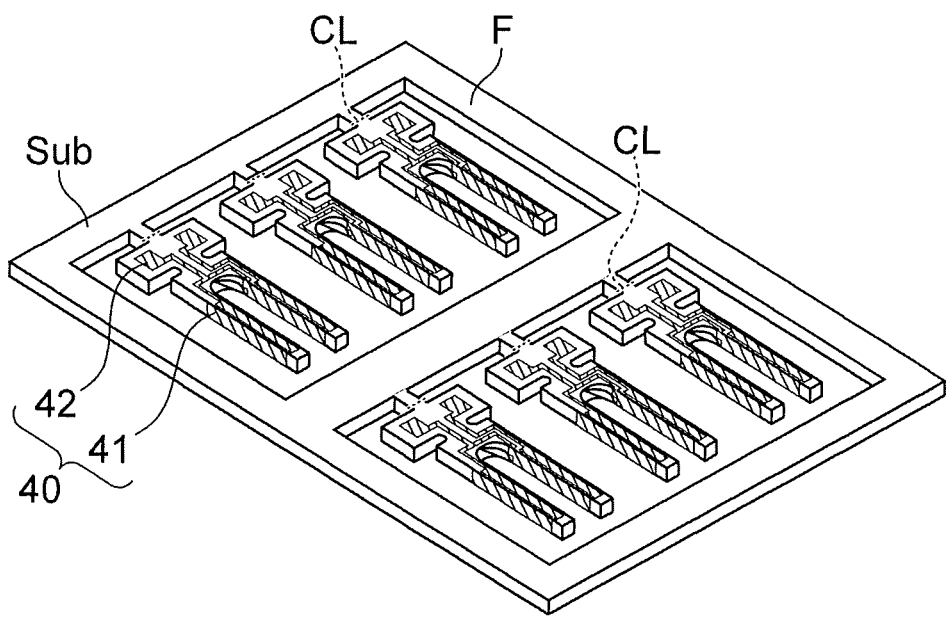

FIGS. 11A and 11B are process perspective views illustrating the other method for manufacturing the device according to the embodiment.

Figure 9A:
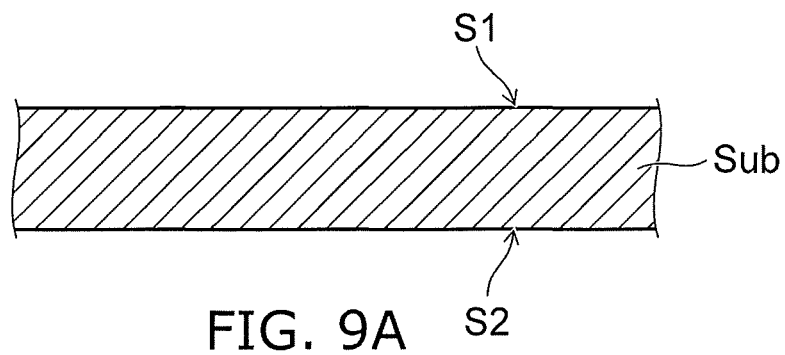
FIGS. 9A to 10C are process cross-sectional views showing another method for manufacturing the device according to the embodiment.
Figure 9B:
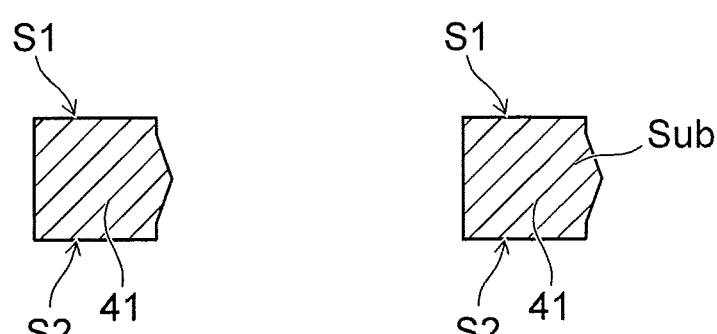

First, the substrate Sub is prepared as illustrated in FIG. 9A. The substrate Sub has the first surface S1 and the second surface S2. The substrate Sub includes silicon oxide. For example, the substrate Sub is patterned into the configuration illustrated in FIG. 9B by blasting. Thereby, as illustrated in FIG. 11A, the multiple base members 40 are made from one substrate Sub.

Figure 9C:
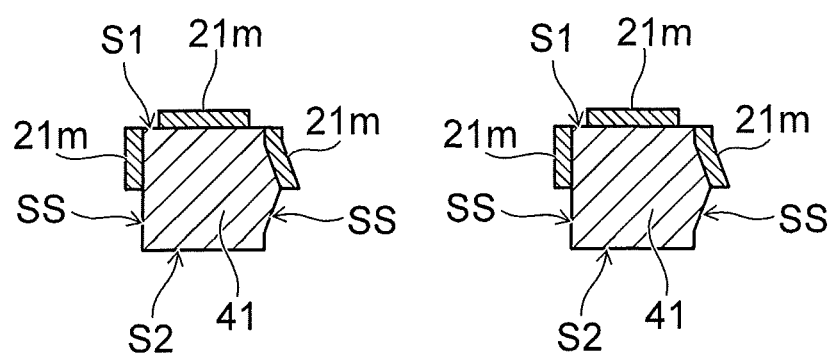

A metal layer 21m is formed at the upper surface US and the side surface SS of the base member 40; and the metal layer 21m is patterned as illustrated in FIG. 9C. Thereby, the first electrode 21, a portion of the third electrode 45, a portion of the multiple interconnects, and a portion of the multiple electrode pads are formed.

Figure 9D:
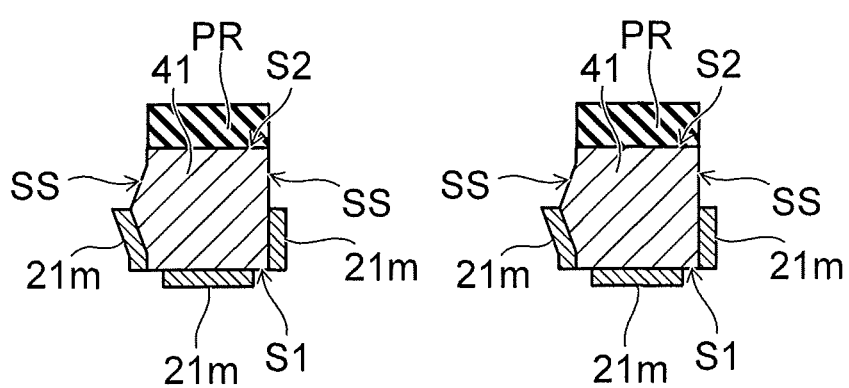
Figure 10A:
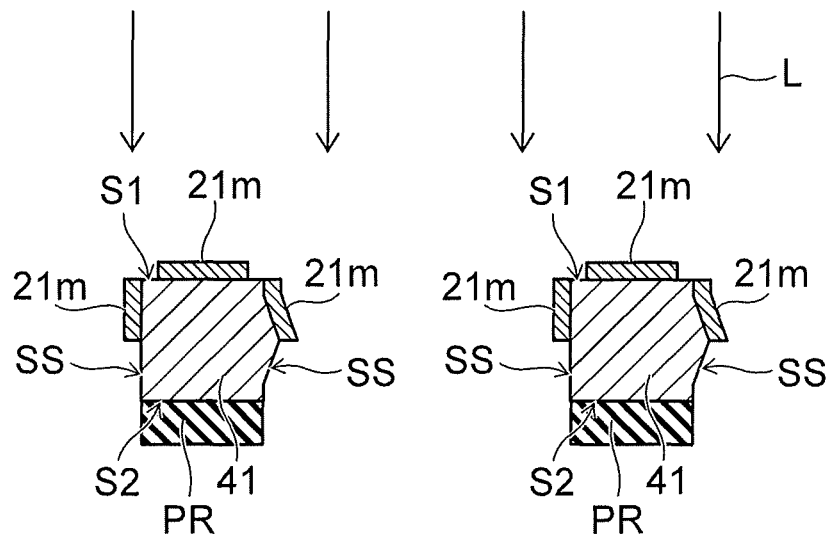

As illustrated in FIG. 9D, the photoresist PR is provided at the second surface S2 of the substrate Sub. As illustrated in FIG. 10A, the light L is irradiated toward the substrate Sub from the first surface S1 side of the substrate Sub. In the case where the substrate Sub is a sapphire substrate including silicon oxide, the light L of a wavelength of 365 nm (the i-line), 405 nm (the h-line), or 436 nm (the g-line) is used. The light L is irradiated on a portion of the photoresist PR through a portion of the substrate Sub where the metal layer 21m is not provided.

Figure 10B:
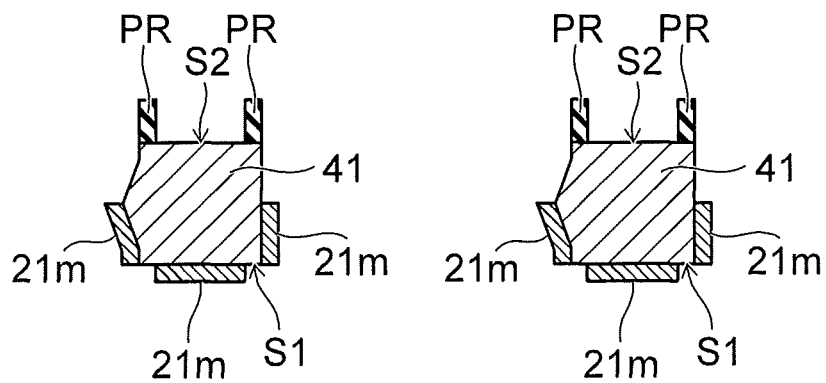
Figure 10C:
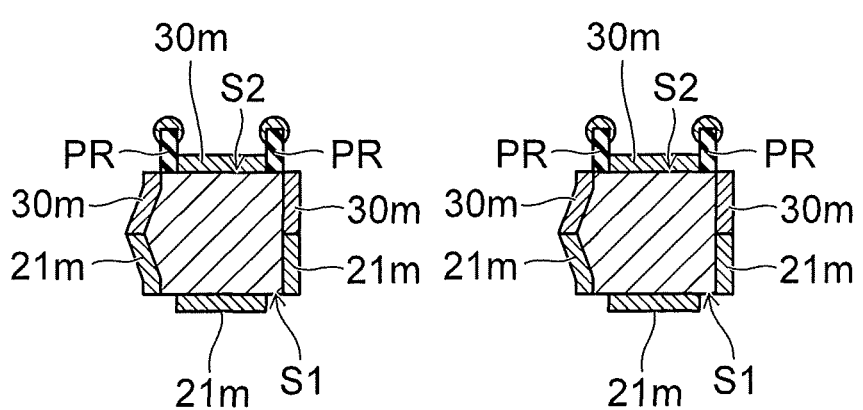

A chemical liquid is coated onto the photoresist PR; and the photoresist PR is developed. Thereby, as illustrated in FIG. 10B, the portion of the photoresist PR remains. As illustrated in FIG. 10C, the metal layer 30m is formed to cover the portion of the photoresist PR, the second surface S2, and the side surface of the extension portion 41.

A chemical liquid for removing the photoresist PR is coated onto the second surface S2. When removing the photoresist PR, the portion of the metal layer 30m formed on the photoresist PR is removed. The multiple interconnects and the multiple electrode pads are formed at the second surface S2 of the base member 40 by patterning the remaining metal layer 30m. As illustrated in FIG. 11B, the substrate Sub is cut along a line CL; and the base members 40 each are cut away from an outer frame F of the substrate Sub. By the processes recited above, the device 4 illustrated in FIG. 8A and FIG. 8B is manufactured.

By using the manufacturing method according to the embodiment as illustrated in FIG. 9A to FIG. 10C, the patterned metal layer 30m can be formed on the second surface S2 side by using the structure body (the metal layer 21m) provided on the first surface S1 side. Therefore, similarly to the manufacturing processes of the semiconductor device, an exposure apparatus that includes a two-sided alignment function is unnecessary. The cost that is necessary to expose the photoresist PR can be reduced; and the cost of the device that is manufactured can be reduced.

According to the manufacturing method according to the embodiment, for example, the device 4 that has the following structure is manufactured. Namely, the length of the first electrode 21 in an orthogonal direction perpendicular to the extension direction in which the extension portion 41 extends is substantially the same as the length of the second electrode 30 in the orthogonal direction. The gap in the orthogonal direction between the first electrode 21 and the third electrode 45 is substantially the same as the gap in the orthogonal direction between the second electrode 30 and the third electrode 45.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A method for manufacturing a device, comprising;
providing a structure body at a first surface of a substrate, the substrate being light-transmissive and having a second surface on a side opposite to the first surface, a light transmissivity of the structure body being lower than a light transmissivity of the substrate;

providing a negative-type photoresist at the second surface;

irradiating the substrate with light to expose a portion of the photoresist by using the structure body as a mask, the light being irradiated in a first direction from the first surface toward the second surface, the light passing through the substrate and being incident at the portion of the photoresist;

developing the photoresist to remain the portion of the photoresist as being adhered to the second surface and to remove other portion of the photoresist; and polishing the second surface side of the substrate after the structure body is provided and before the photoresist is provided.

2. The method according to claim 1, wherein a plurality of the structure bodies is provided at the first surface, the plurality of structure bodies is mutually-separated, and the portion of the photoresist is exposed in the irradiating the substrate by using the plurality of structure bodies as a mask.

3. The method according to claim 2, further comprising:

exposing a portion of the second surface by removing another portion of the photoresist after the irradiating the substrate;

forming a metal layer covering the portion of the photoresist and the exposed portion of the second surface; and removing a portion of the metal layer by removing the portion of the photoresist.

4. The method according to claim 3, wherein each of the plurality of structure bodies includes a first electrode, and an insulating portion provided around the first electrode, and a plurality of second electrodes is mutually-separated and is formed at the second surface by removing the portion of the metal layer.

5. The method according to claim 4, wherein a length of the structure body in a second direction perpendicular to the first direction is the same as a length of the second electrode in the second direction.

6. The method according to claim 3, further comprising dicing the substrate along a dicing line, the dicing line passing between adjacent ones of the plurality of structure bodies and through a portion where the portion of the metal layer is removed.

7. The method according to claim 2, where a distance between adjacent ones of the plurality of structure bodies is not less than 10 µm and not more than 1 mm.

8. The method according to claim 1, wherein the substrate includes silicon carbide, or gallium nitride.

9. A method for manufacturing a device, comprising;

providing a structure body at a first surface of a substrate, the substrate being light-transmissive and having a second surface on a side opposite to the first surface, a light transmissivity of the structure body being lower than a light transmissivity of the substrate;

providing a negative-type photoresist at the second surface;

irradiating the substrate with light to expose a portion of the photoresist by using the structure body as a mask, the light being irradiated in a first direction from the first surface toward the second surface, the light passing through the substrate and being incident at the portion of the photoresist; and developing the photoresist to remain the portion of the photoresist as being adhered to the second surface and to remove other portion of the photoresist; and polishing the second surface side of the substrate after the structure body is provided and before the photoresist is provided;

wherein a plurality of the structure bodies is provided at the first surface, the plurality of structure bodies is mutually-separated, and the portion of the photoresist is exposed in the irradiating the substrate by using the plurality of structure bodies as a mask;

further comprising:

exposing a portion of the second surface by removing another portion of the photoresist after the irradiating the substrate;

forming a metal layer covering the portion of the photoresist and the exposed portion of the second surface; and removing a portion of the metal layer by removing the portion of the photoresist; wherein each of the plurality of structure bodies includes a first electrode, and an insulating portion provided around the first electrode, and a plurality of second electrodes is mutually-separated and is formed at the second surface by removing the portion of the metal layer.

10. The method according to claim 9, wherein a length of the structure body in a second direction perpendicular to the first direction is the same as a length of the second electrode in the second direction.

11. A method for manufacturing a device, comprising;

providing a structure body at a first surface of a substrate, the substrate being light-transmissive and having a second surface on a side opposite to the first surface, a light transmissivity of the structure body being lower than a light transmissivity of the substrate;

providing a negative-type photoresist at the second surface;

irradiating the substrate with light to expose a portion of the photoresist by using the structure body as a mask, the light being irradiated in a first direction from the first surface toward the second surface, the light passing through the substrate and being incident at the portion of the photoresist;

developing the photoresist to remain the portion of the photoresist as being adhered to the second surface and to remove other portion of the photoresist; and polishing the second surface side of the substrate after the structure body is provided and before the photoresist is provided; wherein a plurality of the structure bodies is provided at the first surface, the plurality of structure bodies is mutually-separated, and the portion of the photoresist is exposed in the irradiating the substrate by using the plurality of structure bodies as a mask; further comprising:

exposing a portion of the second surface by removing another portion of the photoresist after the irradiating the substrate;

forming a metal layer covering the portion of the photoresist and the exposed portion of the second surface;

removing a portion of the metal layer by removing the portion of the photoresist; and dicing the substrate along a dicing line, the dicing line passing between adjacent ones of the plurality of structure bodies and through a portion where the portion of the metal layer is removed.

* * * * *